United States Patent [19]
Galvin-Donoghue et al.

[11] Patent Number: 5,756,266
[45] Date of Patent: May 26, 1998

[54] PROCESS FOR MANUFACTURING DEVICES USING MALEIMIDE CONTAINING RESIST POLYMERS

[75] Inventors: Mary Ellen Galvin-Donoghue, Titusville; Elsa Reichmanis, Westfield, both of N.J.

[73] Assignee: Lucent Technologies Inc., Murray Hill, N.J.

[21] Appl. No.: 679,749

[22] Filed: Jul. 15, 1996

Related U.S. Application Data

[63] Continuation of Ser. No. 372,714, Jan. 13, 1995, abandoned, which is a continuation of Ser. No. 148,719, Nov. 8, 1993, abandoned.

[51] Int. Cl.$^6$ ............................................. G03C 5/00
[52] U.S. Cl. .................. 430/323; 430/325; 430/326; 430/330; 430/270.1; 430/910
[58] Field of Search ........................... 430/325, 326, 430/270.1, 330, 906, 323, 910

[56] References Cited

U.S. PATENT DOCUMENTS

| | | | |
|---|---|---|---|
| 4,847,327 | 7/1989 | Rupp et al. | 430/311 |
| 4,931,379 | 6/1990 | Brunsvold et al. | 430/270 |
| 4,939,070 | 7/1990 | Brunsvold et al. | 430/312 |
| 4,968,581 | 11/1990 | Wu et al. | 430/192 |
| 4,996,136 | 2/1991 | Houlihan et al. | 430/313 |
| 5,130,392 | 7/1992 | Schwolm et al. | 430/270 |
| 5,200,544 | 4/1993 | Houlihan et al. | 558/44 |

FOREIGN PATENT DOCUMENTS 0 187 517 A2  7/1986  European Pat. Off. .

OTHER PUBLICATIONS

Buhr et al.. Non–Ionic Photacid Generating Compounds. Polymeric Materials Science and Engineering, pp. 269–277, 1989.

Kwang–Duk Ahn et al.. "Synthesis and polymerization of N–(tert–butyloxycarbonyl maleimide and facile deprotection of polymer side–chain t–BOC groups." Polymer, vol. 33, No. 22 (1992) pp. 4851–4856.

S.M. Sze, VLSI Technology, McGraw–Hill, New York, (1983).

L.F. Thompson, Introduction to Microlithography, American Chemical Society Symposium, Series 219, (1983) pp. 87–161.

*Primary Examiner*—George F. Lesmes
*Assistant Examiner*—Laura Weiner
*Attorney, Agent, or Firm*—Richard J. Botos

[57] ABSTRACT

A lithographic process for fabricating a device is disclosed. An area of radiation sensitive material is formed on a substrate. The radiation sensitive material contains a polymeric component The polymeric component is the copolymerization product of a maleimide monomer and at least two other monomers. Acid labile groups are pendant to one of the monomers with which the maleimide monomer is copolymerized. The acid labile groups are pendant to less than 50 mole percent of the monomers that make up the copolymer. The acid labile groups are not pendant to the maleimide monomer.

The radiation sensitive material is patternwise exposed to radiation after it is formed on the substrate. The patternwise exposure transfers an image into the radiation sensitive material. The image is developed into a pattern in the radiation sensitive material. The pattern is then transferred into the substrate.

14 Claims, No Drawings

PROCESS FOR MANUFACTURING DEVICES USING MALEIMIDE CONTAINING RESIST POLYMERS

This application is a continuation application Ser. No. 08/372,714, filed on Jan. 13, 1995, now abandoned, which is a continuation of application Ser. No. 08/148,719, filed on Nov. 8, 1993, now abandoned.

BACKGROUND OF THE INVENTION

1. Field of the Invention

This invention relates to the fabrication of devices by a lithographic process.

2. Art Background

Devices such as integrated circuits are complex structures made of a variety of materials. These materials are precisely configured to form the desired device. The materials are configured using a variety of processes. A lithographic process is frequently used to transfer the desired configuration into a substrate to fabricate such devices.

Lithographic processes transfer the desired configuration into the substrate using intermediate materials frequently referred to as resists. An image of the desired configuration is first introduced into the resist by exposing the resist to radiation in a patternwise manner. The pattern defines the configuration that is to be transferred, ultimately, into the substrate. The radiation introduces the image into the resist by inducing a chemical change in those portions of the resist that are exposed to the radiation. This chemical change is then exploited to develop a pattern from the image in the resist. The pattern is then transferred from the resist into the substrate.

The efficacy of a lithographic process depends at least in part on the resist used to transfer the pattern into the substrate. Certain types of resists offer particular advantages in the context of lithographic processes. For example, some resists undergo chemical amplification, i.e., the effect of the radiation is amplified because the radiation induces a chemical event which propagates multiple other chemical events.

Certain chemically amplified resists include a polymer in which the aqueous base solubility of the polymer is reduced by pendant protective groups. These protective groups are stripped from the polymer by a catalyst that is produced by incident radiation. The resist material in the exposed region, but not the unexposed region, consequently undergoes a change in aqueous base solubility. The difference in the aqueous base solubility between the unexposed and exposed regions of the resist is then exploited to develop the pattern into the resist.

Examples of chemically amplified resists are disclosed in U.S. Pat. No. 4,939,070 to Ito et al. These resists contain hydroxystyrene polymers that have recurrent pendant groups such as t-butoxycarbonyl (tBOC) groups. These groups replace the hydrogen in the hydroxyl moiety pendant to the styrene polymer backbone and reduce the aqueous base solubility of the hydroxystyrene when so attached. These reactive groups are cleaved from the polymer in the presence of acid which is generated by exposing the resist to radiation. When the reactive groups are cleaved from such polymers, they are replaced by hydrogen atoms and, as a result, the polymers' aqueous base solubility changes from relatively insoluble to relatively soluble.

It is an objective of a lithographic process to transfer a pattern from a resist into a device as accurately as possible. It follows that it is undesirable for the resist to distort with a concomitant distortion in the resist image and the resulting device pattern.

Such distortion of the resist and, consequently, the image in the resist, is caused by the resist expanding or shrinking during the lithographic process. The resist shrinks when the bulky protective groups are removed from the polymer in substantial numbers. The resist expands if it is exposed to temperatures above its glass transition temperature, $T_g$, thereby causing it to flow during the lithographic process.

Maleimide-containing polymers have been used as chemically amplified resists in lithographic processes. Examples of maleimide-containing resists are disclosed in U.S. Pat. Nos. 4,931,379 and 4,939,070, both to Brunsvold et al. and U.S. Pat. No. 4,968,581 to Wu et al. Another example of a maleimide-containing resist composition is disclosed in Ahn et al., "Synthesis and polymerization of N-(tert-butyloxycarbonyl) maleimide and facile deprotection of polymer side-chain tBOC groups," Polymer, 33(22): 4851–4856 (1992). These resists demonstrate the desired resistance to flow when exposed to high temperatures, but shrink too much during deprotection and subsequent lithographic processing.

SUMMARY OF THE INVENTION

The present invention is directed to a lithographic process for device fabrication in which a maleimide-containing polymer is incorporated into the resist material. The maleimide-containing polymer has properties which make it particularly suited for use in a lithographic process.

The maleimide-containing polymer of the present invention is a polymerization product of maleimide monomers and other monomers. The polymerization product is referred to herein as a copolymer, although it may be the polymerization product of more than two monomers. The copolymer is a sequence of repeating units. Substantially every repeating unit, in turn, contains two units of monomer. The maleimide monomer is preferably either maleimide or a lower alkyl-substituted maleimide. "Lower alkyl" means up to two carbon atoms in either a straight chain or a branched configuration. One example of a lower alkyl-substituted maleimide is N-methyl maleimide. Other examples of lower alkyl-substituted maleimides include ethyl maleimide. The maleimide monomer is either one maleimide monomer, e.g., 100 percent of the maleimide monomer is maleimide, N-methyl maleimide, etc., or a mixture of maleimide monomers, e.g., a combination of maleimide and N-methylmaleimide. It is advantageous if the copolymer is about 40 mole percent to about 60 mole percent maleimide monomer and there is about one maleimide monomer in each repeating unit. The other monomer or monomers are also about 40 mole percent to about 60 mole percent of the resulting copolymer and there is one of these other monomers in substantially every repeating unit Thus, the copolymer has an alternating structure in which, roughly, each maleimide monomer is separated by at least one other monomer.

At least a portion of the other monomer or monomers have pendant acid labile groups. These pendant acid labile groups reduce the aqueous base solubility of the monomers and the copolymers of these monomers and the maleimide monomers. Once these acid labile groups are cleaved from the polymer, the polymer is more soluble in aqueous base solution. This difference in aqueous base solubility is exploited to develop a pattern in a resist from the image transferred into the resist via the patternwise exposure.

Examples of the acid labile groups include t-butyl, t-butoxycarbonyl (t-BOC hereinafter), t-amyloxy carbonyl and 2 methyl-3-trimethylsilyl-2-propanyloxycarbonyl. In the presence of acid, these groups produce a carbonium ion that is sufficiently stable to allow the elimination of an available a-hydrogen.

Typically the copolymer is formulated such that less than half of the repeating units contain a monomer with these pendant acid labile groups. The polymer is so formulated by copolymerization with yet another monomer, e.g., an acetoxystyrene or a trimethylsilylstyrene monomer. The copolymer contains a mole percent of this other monomer that is sufficient to ensure that the monomer with the pendant acid labile groups is present in less than half of the repeating units in the copolymer. Consequently, the polymer structure is a series of alternating repeating units. Essentially every repeating unit contains a maleimide monomer in combination with another monomer. The other monomer in essentially every repeating unit either has an acid labile group pendant thereto, or it does not have an acid labile group pendant thereto. It is advantageous if less than fifty percent of the repeating units contain a monomer with an acid labile group pendant thereto.

The maleimide-containing polymer has many desirable thermal properties. The acid labile groups generally do not thermally cleave from the maleimide-containing polymer in appreciable amounts at temperatures less than 180° C. in the absence of acid; the maleimide-containing polymer itself does not begin to thermally decompose at temperatures less than 400° C. and has a glass transition temperature, $T_g$, above 200° C. Both the thermal decomposition temperature and the glass transition temperature are above the temperature at which the acid labile groups begin to cleave from the polymer in substantial amounts. Thus, at temperatures above 180° C., the acid labile groups are no longer attached to the polymer in appreciable amounts. These thermal properties reduce the amount by which the resist distorts during the lithographic process. With proper processing the resist composition loses less that 20 percent of its weight during the imaging and post exposure baking steps in the lithographic process.

DETAILED DESCRIPTION

The process of the present invention is a lithographic process for device fabrication. The process includes at least one lithographic step. Processes for device fabrication which include lithographic steps have been described in treatises such as *VLSI Technology*, S.M. Sze, McGraw-Hill, New York (1983) and *Introduction to Microlithography*, American Chemical Society Symposium Series 219, L.F. Thompson et al., pages 87-161 (1983). Lithographic steps typically include exposing and patterning delineable materials, i.e. resists.

The resist composition used in the process of the present invention contains a polymer that is the copolymerization product of maleimide-containing monomers and other monomers. The resist composition has excellent thermal properties and shrinks less during the lithographic process.

The resist composition functions as a medium in a lithographic process through which features are transferred into a substrate. An image is introduced into the resist, and that image is developed to form a pattern. The pattern is then transferred into the substrate.

The resist composition used in the present process contains the polymerization product of three or more monomers. The polymerization product is referred to herein as a copolymer. The copolymer is formed by polymerizing a feed composition of maleimide-containing monomers and other monomers. The maleimide-containing monomer in the feed is preferably maleimide, a lower alkyl-substituted maleimide such as N-methyl maleimide or a combination of the two. About 40 mole percent to about 60 mole percent of the monomers that are polymerized to form the polymer are maleimide-containing monomers. It is advantageous if about 45 mole percent to about 55 mole percent of the monomers that are copolymerized to form the polymer are maleimide-containing monomers.

The maleimide-containing monomer or monomers are preferably copolymerized with styrene-containing monomers. The feed composition is about 40 to about 60 mole percent styrene-containing monomers. It is advantageous if the feed composition is about 45 mole percent to about 55 mole percent styrene-containing monomers. Only a portion (about 30 mole percent to about 50 mole percent) of these styrene-containing monomers in the feed composition have pendant acid labile groups. The maleimide containing monomers and the styrene-containing monomers copolymerize to form a polymer with an alternating structure, i.e., a maleimide monomer is attached to a styrene containing monomer which is attached to another maleimide monomer, etc.

The pendant acid labile groups are used to manipulate the aqueous base solubility of the copolymers to which they are pendant. For example, the pendant acid labile groups reduce the aqueous base solubility of the copolymers if they replace more polar groups that are pendant to the polymer. In a specific illustration, suppose that the hydrogen of a hydroxyl moiety in a hydroxystyrene polymer is substituted by an acid labile group such as t-butoxycarbonyl (tBOC). Since the hydroxyl functional group of the hydroxystyrene monomer is polar, hydroxystyrene is relatively soluble in a solution of aqueous base. The tBOC group is significantly less polar than the hydroxyl functional group. Consequently, a copolymer containing hydroxy styrene with pendant tBOC groups in place of the hydrogens in the hydroxyl functional groups is less soluble in aqueous base relative to a copolymer containing hydroxystyrene with no such pendant tBOC groups. The hydroxy functionality is thus "protected" by the pendant tBOC groups. Removing these tBOC groups "deprotects" the hydroxy functionality.

When these acid labile groups are cleaved from the polymer, the polymer is more soluble in aqueous base solution. This difference in aqueous base solubility is exploited to develop a pattern in a resist from the image transferred into the resist via the patternwise exposure.

Examples of suitable acid labile groups include t-butyl, tBOC, t-amyloxycarbonyl, and 2-methyl-3-trimethylsilyl-2-propanyloxycarbonyl. These substituents are chosen to produce in the presence of acid a carbonium ion that is sufficiently stable to allow the elimination of an available α-hydrogen. These substituents are described in U.S. Pat. No. 4,996,136 to Houlihan et al., the teachings of which are incorporated by reference.

The remaining portion of the styrene-containing monomers in the feed composition do not have the acid labile pendant groups (about 70 mole percent to about 50 mole percent of the styrene-containing monomers). Preferably the total copolymer feed composition is about 25 to about 35 mole percent of the styrene-containing monomers that do not have acid labile groups pendant thereto. Examples of such monomers include styrene, acetoxystyrene, and hydroxystyrene. Preferably one such monomer is m-hydroxystyrene.

The resulting maleimide-containing polymer is a copolymer of about 40 mole percent to about 60 mole percent maleimide monomers, and about 40 mole percent to about 60 mole percent styrene-containing monomers. Of the styrene-containing monomer, about 30 mole percent but less than about 50 mole percent have pendant acid labile groups and about 50 mole percent to about 70 mole percent do not have such pendant acid labile groups.

The copolymer is formed by preparing a feed composition which contains monomers in the relative amounts that reflect the desired composition of the copolymer. Thus, if the composition of the copolymer is desired to be 0.25 hydroxystyrene-0.25 t-butoxycarbonyloxystyrene-0.5-N-methyl maleimide, the feed composition is 25 mole percent protected hydroxystyrene, 25 mole percent tBOC oxystyrene and 50 mole percent N-methyl maleimide. Protected hydroxystyrene is hydroxystyrene in a form that makes it susceptible to polymerization, such as the m-trimethylsilyl ether of hydroxystyrene. One skilled in the art will recognize that a number of different protected styrenes can be introduced into the feed composition to effect the desired copolymerization. The monomers are combined in a suitable solvent such as cyclohexanone and polymerized using techniques known to those skilled in the art.

The degree of difference in the aqueous base solubility between the polymer in one area of the resist versus another is related to the relative number of acid labile groups pendant to the polymer in these two regions. The acid labile pendant groups are cleaved from both regions of the resist if the resist is exposed to heat above a certain temperature. Uniform thermal cleavage of the acid labile pendant groups from both the unexposed and exposed areas of the resist does not contribute to the contrast between the two areas.

During a lithographic process, the resist is heated prior to being exposed to radiation. In the present process, it is preferred that the resist be heated to a temperature which is less than the temperature at which these pendant groups will cleave from the polymer, generally about 180° C. This threshold temperature for the onset of thermal deprotection is higher than many other conventional resists, and it provides more latitude in selecting processing conditions.

The maleimide-containing polymer also has other properties which make it attractive for use in a resist material. The polymer does not begin to thermally decompose at temperatures less than 400° C. and the glass transition temperature, $T_g$, of the polymer is above 200° C. Of course, the polymer will have become virtually completely deprotected before it reaches either of these temperatures. These thermal properties provide the polymer with a good resistance to distortion during the lithographic process, especially during the baking step following the exposure step and the subsequent pattern transfer steps.

The number of acid labile groups pendant to the polymer is limited. It is advantageous if these groups are pendant to 30 mole percent or less of the monomers in the copolymer. As discussed above, by cleaving the acid labile groups from the polymer, the aqueous base solubility of the polymer is changed. This change in aqueous base solubility is then exploited to develop a pattern in the resist.

However, when the acid labile groups are cleaved from the polymer, the polymer shrinks upon deprotection during the baking step. Therefore, a balance between the desired effect of changing the aqueous base solubility of the polymer by cleaving these acid labile groups and the undesired effect of polymer shrinkage by cleaving too many such groups is sought.

One way to achieve this balance is to limit the amount of acid labile groups affixed to the polymer in the first instance. The copolymer of the present invention has fewer such acid labile groups because the acid labile groups are affixed to only one of several monomers that are copolymerized to form the polymer. That monomer to which the acid labile group is affixed is less than about 30 mole percent of the polymer feed composition and, thus, less than about 30 mole percent of the monomers that make up the polymer have an acid labile group affixed thereto.

The maleimide containing copolymer is combined with other materials to form the resist. Preferably, the maleimide-containing polymer is combined with a photoacid generator to form the resist. The photoacid generator generates an acid when exposed to certain forms of energy. The acid so generated cleaves the acid labile groups from the maleimide-containing resist polymer, rendering the polymer more soluble in aqueous base relative to the aqueous base solubility of the polymer from which these groups have not been cleaved. Examples of suitable photoacid generators include bis(2-nitro-6-trifluoromethylbenzyl)1-3-benzene disulfonate and other photoacid generators disclosed in U.S. Pat. Nos. 4,996,136 and 5,200,544, both to Houlihan et al., the teachings of which are incorporated by reference.

The resist is applied onto a substrate using known techniques and is then patternwise exposed to radiation. The wavelength of this radiation is preferably about 220 nm to about 300 nm. The radiation dosage is preferably about 4 mJ/cm$^2$ to about 80 mJ/cm$^2$ for an exposure to radiation at about 248 nm wavelength. The patterned resist is then subjected to a post exposure baking step at a temperature of about 110° C. to about 170° C. It is advantageous if the baking step occurs at about 140° C. to about 165° C. The composition of the copolymer in the resist is such that the weight of the resist after the resist has been exposed to radiation and baked is at least about 80 percent of the weight of the resist applied on the substrate. It is advantageous if the composition of the copolymer in the resist is such that the weight of the resist after exposure to radiation and post exposure bake is about 85 percent or more of the weight of the resist applied onto the substrate.

The following examples are provided to illustrate the invention that is defined by the claims appended to this description.

EXAMPLE 1

Preparation of Maleimide-Containing Copolymers

Maleimide and N-methyl maleimide monomers were obtained from the Aldrich Chemical Co. of Milwaukee, Wisconsin. Tert-butoxycarbonyloxystyrene and acetoxystyrene were obtained from Hoechst-Celanese, Inc. of Corpus Christi, Tex. The monomers were combined in a solution of cyclohexanone. The cyclohexanone was obtained from the Aldrich Chemical Co.

The monomers were combined in concentrations of about 2.5 mole per liter of solvent. The ratio of styrene-type monomers to maleimide monomers was about 1:1. Several polymerizations were made and the ratio of acetoxystyrene to t-butoxycarbonyloxystyrene was varied from polymerization to polymerization. The ratio of maleimide monomer to N-methyl maleimide monomer was also varied from polymerization to polymerization.

Polymers were prepared from three different monomer mixtures. In one mixture the feed composition was 25 mole percent acetoxystyrene, 25 mole percent t-butoxycarbonyloxystyrene and 50 percent N-methyl maleimide (0.25 acetoxystyrene-0.25 t-butoxycarbonyloxystyrene-0.5 N-methylmaleimide). This composition is hereinafter referred to as the "0.25 acetoxystyrene terpolymer". The other two mixtures were 0.38 acetoxystyrene-0.12 t-butoxycarbonyloxystyrene-0.5 N-methyl maleimide (hereinafter referred to as the "0.38 acetoxystyrene terpolymer") and 0.25 acetoxystyrene-0.25 t-butoxycarbonyloxystyrene-0.25 N-methyl maleimide-0.25 maleimide (hereinafter referred to as the "tetrapolymer").

The three mixtures of solvent and monomers were each charged into a separate reaction vessel. Each vessel with the monomer mixture therein was purged with nitrogen for two hours. The solution was then heated to 60° C. after which dodecyl thiol (0.25 ml) was added to the solution. A free-radical initiator, azo-bis-isobutylnitride was then added to the solution.

Each polymerization was allowed to proceed for two hours. Each solution was then combined with methanol, to precipitate these polymers from these solutions. Each of the resulting polymer precipitates was reprecipitated twice by first dissolving the polymer in tetrahydrofuran followed by precipitation into methanol. The purified polymers were dried in a vacuum oven at ambient temperature for two days.

The 0.25 acetoxystyrene terpolymer and the tetrapolymer were evaluated to determine their actual composition based on their feed composition using $^{13}$C NMR spectra. The spectra were recorded on a JEOL GX-500 spectrometer at a resonance frequency of 125 MHz. Quantitative spectra were obtained at 50° C. with a gated coupling without a nuclear Overhauser effect. A 15 second pulse delay was used. The polymers were dissolved in a d-chloroform solvent.

The NMR spectra of the terpolymer was 0.24 acetoxystyrene-0.25 t-butoxycarbonyloxystyrene -0.5 N-methylmaleimide. The NMR spectra of the tetrapolymer was 0.27 acetoxystyrene-0.26 t-butoxycarbonyloxystyrene-0.36 N-methylmaleimide-0.12 maleimide. Both of the polymers had a composition that was about 50 percent styrene-containing monomers and 50 percent maleimide monomers. Thus, the polymer composition corresponded to the feed composition with regard to the relative amounts of maleimide and styrene in the polymer and in the feed. However, the NMR data suggest that the N-methylmaleimide polymerized preferentially over the maleimide.

The composition of the 0.38 acetoxystyrene terpolymer was determined by thermal gravimetric analysis (TGA). The analysis was performed on a Perkin-Elmer DSC 7 system. The runs were done at 10° C. per minute. Based on this analysis, and assuming that the polymer is 50 mole percent N-methylmaleimide, the composition of the 0.38 acetoxystyrene terpolymer was determined to be 0.38 acetoxystyrene - 0.12 t-butoxycarbonyloxystyrene - 0.5 N-methylmaleimide. Thus, the mole ratio of monomers that make up the polymer were the same as the mole ratios of the monomers in the feed.

EXAMPLE 2

Preparation of a Copolymer of Styrene, t-butoxycarbonyloxy Styrene and N-methylmaleimide The feed composition contained the m-trimethylsilylether of styrene (3.6 ml), tBOC oxystyrene (4.8 ml) and N-methyl maleimide (4.89 g) combined with cyclohexanone (125 ml). The preparation of hydroxystryene-containing polymers from silylether protected hydroxystyrene-containing polymers is disclosed in Chandross-Kometani-Nalamasu-Reichmanis-Uhrich 65-2-4-19-1, which has been filed concurrently herewith and is hereby incorporated by reference. The resulting mixture was purged with argon for 1 hour. After the argon purge was completed, n-dodecyl thiol (0.12 ml) was added to the mixture. The mixture was then heated to 60° C. A free radical initiator, azo-bis-isobutylnitride, was then added to the mixture.

The mixture was allowed to polymerize for 2 hours. The mixture was then combined with methanol (500 ml) and hydrochloric acid (HCl;0.12 ml) to precipitate the polymer from the mixture. The polymer precipitate was then reprecipitated (twice) by dissolving the polymer in tetrahydrofuran followed by precipitating the polymer in methanol.

The polymer was evaluated as described above to determine its actual composition based on its feed composition. The results of this analyses showed the polymer to be 0.2 hydroxystyrene - 0.3 t-butoxycarbonyloxystyrene - 0.5 N-methyl maleimide. This polymer is referred to herein after as the "0.2 hydroxystyrene" terpolymer.

EXAMPLE 3

Preparation of Copolymers of Maleimide-Containing Monomers and Styrene-Containing Monomers Styrene was obtained from the Aldrich Co. of Milwaukee, Wis. The monomer was slurried with alumina prior to polymerization. Maleimide and N-methyl maleimide were also obtained from the Aldrich Co. The t-butoxycarbonyloxystyrene was obtained from Hoechst-Celanese, Inc. of Corpus Christi, Tex. The monomers were combined in cyclohexanone, which was obtained from the Aldrich Co., at a concentration of 2.5 moles of monomer per liter of solvent. The mole ratio of styrene monomer to t-butoxycarbonyloxystyrene was about 1:1. The concentration of maleimide and N-methyl maleimide in the feed composition depended upon the desired amount of these two monomers in the resulting polymers. In one polymerization, the feed composition was 25 mole percent styrene, 25 mole percent t-butoxycarbonyloxystyrene and 50 mole percent maleimide. In another polymerization, the feed composition was 25 mole percent styrene, 25 mole percent t-butoxycarbonyloxystyrene, 35 mole percent N-methylmaleimide and 15 mole percent maleimide.

The two feed compositions described above were charged into separate reaction vessels. The polymerizations took place under a nitrogen atmosphere at a temperature of about 60° C. A free radical initiator, azo-bis-isobutylnitrile was then added to the solution. Dodecyl thiol (0.12 ml) was added to the solution to reduce the molecular weight of the polymer.

The polymerizations were allowed to proceed for 3 hours. Each solution was then combined with methanol to precipitate the polymer from the solution. Each polymer was reprecipitated twice by dissolving it in tetrahydrofuran followed by precipitation into methanol. The purified polymer were placed in a vacuum oven overnight at ambient temperature.

The polymers were evaluated to determine their actual composition based on their feed composition using C NMR spectra. The spectra were recorded on a JEOL GX-500 spectrometer at a resonance frequency of 125 MHz. Quantitative spectra were obtained at 50° C. with a gated coupling without a nuclear Overhauser effect. A 15 second pulse delay was used. The polymers were dissolved in a d-chloroform solvent.

EXAMPLE 4

Device Fabrication Using the Process of the Present Invention

Each of the copolymers synthesized as described in Examples 1, 2 and 3 were combined with 2-methoxymethyl ether. The concentration of copolymer in the ether was 20 weight percent per unit volume. A photoacid generator, bis(2-nitro-6-trifluoromethylbenzyl)-1,3 benzene disulfonate, was added to each of the solutions. The amount of photoacid generator added was about 12 percent by weight relative to the amount of copolymer in solution for the copolymers of Examples 1 and 2. The amount of photoacid generator was about 10 percent by weight for the copolymers of Example 3.

Each solution was spin-coated onto a four inch silicon substrate at a speed of 2000 rpm (400 rpm for the Example 3 polymers). The films so deposited on the substrates were 1 micron thick films. The coated substrates were subjected to a pre-exposure bake at a temperature of about 120° C. for 1 minute to remove the solvent from the film.

The coated substrates were then exposed to radiation using a Karl Süss Inc., model MA56A contact aligner. The aligner was fitted with a Lambda Physik Excimer laser operating at a wavelength of 248 nm. The radiation dosage was about 2 mJ/cm$^2$/sec and the amount of time that the coated substrate was exposed to radiation was varied from about 2 seconds to about 40 seconds.

The coated substrates were then post-exposure baked. The terpolymers were baked at a temperature of 165° C. for 40 seconds. The tetrapolymers containing maleimide and N-methyl maleimide were baked at a temperature of 155° C. for 40 seconds. The copolymers of Examples 2 and 3 were baked at a temperature of 150° C. for 40 seconds.

The image in each of the exposed films was then developed. The substrates with films of the 0.25 acetoxystyrene terpolymer and the copolymers of Examples 2 and 3 deposited thereon were immersed for 40 seconds in a solution of tetramethylammonium hydroxide (TMAH) (9.7 volume percent; 25 weight percent in water), water (71.6 volume percent). Isopropanol (18.7 volume percent) was also added to the solutions containing the Example 3 copolymers and the 0.25 acetoxystyrene terpolymer. The substrate with the film of tetrapolymer deposited thereon was immersed for 30 seconds in a solution of TMAH (5.2 volume percent), water (77.7 volume percent) and isopropanol (17 volume percent). The substrate with the 0.38 acetoxystyrene terpolymer deposited thereon was immersed in a developer solution but the film did not dissolve.

EXAMPLE 5

Weight Loss of Polymers Upon Thermal Deprotection

The weight loss of each of the polymers synthesized in Examples 1 and 2 was measured when the t-butoxycarbonyl groups were removed from those polymers. The weight loss was measured using thermal gravimetric analysis (TGA) performed on a Perkin-Elmer DSC7 system. The results of these measurements are:

| Polymer | Weight Loss (%) |
| --- | --- |
| 0.25 acetoxy terpolymer | 15.3 |
| 0.38 acetoxy terpolymer | 8.3 |
| tetrapolymer | 15.3 |
| 0.2 hydroxystyrene terpolymer | 17.9 |

EXAMPLE 6

Thermal Properties of Polymers

Polymers synthesized as described in Examples 1, 2 and 3 were subjected to thermal gravimetric analysis as described in Example 5 to determine at what temperature the t-butoxycarbonyl groups began to cleave from the polymers so synthesized. The glass transition temperature $T_g$ of each polymer was also measured. The $T_g$ of the polymers was measured using a Perkin-Elmer DSC 7 at a scan rate of 20° C./min. The following results were obtained:

| Polymer | Deprotection Temp. (°C.) | Decomposition Temp. (°C.) | $T_g$ of Polymer |
| --- | --- | --- | --- |
| Example 1 Polymers | | | |
| 0.25 acetoxy-styrene terpolymer | 194 | 442 | 220 |
| 0.38 acetoxy-styrene terpolymer tetrapolymer | 196 | 413 | |
| | 184 | 420 | 240 |
| Example 2 Polymer | | | |
| 0.5 maleimide 0.25 t BOCstyrene 0.25 styrene terpolymer | 191 | 437 | |
| Example 3 Polymers | | | |
| 0.25 styrene- 0.5 maleimide- 0.25 tBOCstyrene terpolymer | 198 | 427 | 230 |
| 0.15 maleimide- 0.35 N-methylmaleimide- 0.25 styrene- 0.25 tBOCstyrene tetrapolymer | 191 | | 243 |

It is noted that the acid labile groups were essentially all cleaved from the copolymers at the glass transition temperature and the decomposition temperature.

We claim:

1. A process for device fabrication comprising:

forming an area of radiation sensitive material on a substrate, the radiation sensitive material comprising a photoacid generator and a copolymer that is a polymerization product of at least three different monomers, wherein a first monomer (X) has attached thereto an acid labile substituent and is not a maleinide monomer, a second monomer is a maleimide monomer (Y) to which no acid labile substituent is attached, and a third monomer (X') that has no acid labile substituent attached thereto and is not a maleimide monomer, wherein monomers with the acid labile substituent attached thereto are less than 50 mole percent of the polymerization product and wherein the polymer is comprised of about 40 mole percent to about 60 mole percent maleimide monomers and wherein the polymer has the following structure:

wherein a+b is less than or equal to one;

exposing at least a portion of the radiation sensitive material to energy to create discrete areas in the resist material that are exposed to energy and separate, adjacent discrete areas of the resist material that remain unexposed to the energy, the discrete areas together defining an image of a pattern; and developing a pattern from the image in the radiation sensitive material; and transferring the pattern developed in the resist material into the substrate by etching.

2. The process of claim 1 further comprising baking the substrate with the radiation sensitive material thereon after the material has been exposed to radiation at a temperature of about 110° C. to about 170° C.

3. The process of claim 2 wherein the weight of the radiation sensitive material after being baked is at least 80 percent of the weight of the radiation sensitive material formed on the substrate.

4. The process of claim 1 wherein the maleimide monomer is selected from the group consisting of maleimide, lower alkyl-substituted maleimide and mixtures of maleimide and lower alkyl substituted maleimide and wherein the polymer is about 50 mole percent maleimide monomer.

5. The process of claim 4 wherein the monomer to which the acid labile substituent is attached to a styrene-containing monomer.

6. The process of claim 5 wherein the acid labile substituent is selected from the group consisting of tertiary alkyl, alkoxycarbonyl, t-amyloxycarbonyl and 2-methyl-3-trimethylsily-2-propanyloxy carbonyl.

7. The process of claim 6 wherein the acid labile substituent is t-butoxycarbonyl.

8. The process of claim 7 wherein the styrene-containing monomer with the acid labile substituent pendant thereto is t-butoxycarbonyloxystyrene.

9. The process of claim 8 wherein the copolymer is more than 15 mole percent but less than 30 mole percent t-butoxycarbonyloxystyrene.

10. The process of claim 6 further comprising baking the substrate with the radiation sensitive material thereon at a temperature of about 110° C. to about 170° C. wherein the weight of the copolymer after baking is at least 80 percent of weight of the copolymer prior to baking.

11. The process of claim 9 wherein the a third monomer is selected from the group consisting of acetoxystyrene and m-trimethylsilyloxystyrene.

12. The process of claim 11 wherein the polymer is about 20 mole percent to about 45 mole percent of the third monomer.

13. The process of claim 11 wherein the polymerization product of m-trimethylsilyloxystyrene is a copolymer comprising m-hydroxystyrene.

14. The process of claim 13 wherein the maleimide monomer is N-methyl maleimide.

* * * * *